US009685358B2

(12) United States Patent
Plazonic et al.

(10) Patent No.: US 9,685,358 B2
(45) Date of Patent: *Jun. 20, 2017

(54) APPARATUS FOR LIQUID TREATMENT OF WAFER SHAPED ARTICLES AND HEATING SYSTEM FOR USE IN SUCH APPARATUS

(71) Applicant: LAM RESEARCH AG, Villach (AT)

(72) Inventors: Ante Plazonic, Feistritz/Drau (AT); Vijay Kumar Badam, Villach (AT); Michael Brugger, Millstatt (AT)

(73) Assignee: Lam Research AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,498

(22) Filed: Jan. 5, 2016

(65) Prior Publication Data

US 2016/0118278 A1    Apr. 28, 2016

Related U.S. Application Data

(62) Division of application No. 13/894,950, filed on May 15, 2013, now Pat. No. 9,245,777.

(51) Int. Cl.
| | |
|---|---|
| *H01L 21/673* | (2006.01) |
| *H01L 21/687* | (2006.01) |
| *F27B 5/14* | (2006.01) |
| *F27D 5/00* | (2006.01) |
| *F27D 11/02* | (2006.01) |
| *H01L 21/67* | (2006.01) |
| *H05B 3/00* | (2006.01) |
| *F27D 3/00* | (2006.01) |

(52) U.S. Cl.
CPC .. *H01L 21/67115* (2013.01); *H01L 21/68728* (2013.01); *H01L 21/68764* (2013.01); *H01L 21/68785* (2013.01); *H01L 21/68792* (2013.01); *H05B 3/0047* (2013.01); *F27B 5/14* (2013.01); *F27D 2003/0087* (2013.01); *H01L 21/67023* (2013.01)

(58) Field of Classification Search
None
See application file for complete search history.

(56) References Cited

U.S. PATENT DOCUMENTS

| | | | |
|---|---|---|---|
| 4,903,717 | A | 2/1990 | Sumnitsch |
| 4,982,693 | A * | 1/1991 | Ebata ................. C23C 16/52 |
| | | | 118/725 |
| 5,595,606 | A | 1/1997 | Fujikawa et al. |
| 5,859,408 | A | 1/1999 | Baxendine |
| 5,965,047 | A | 10/1999 | Blersch et al. |
| 6,121,579 | A | 9/2000 | Aoki et al. |

(Continued)

FOREIGN PATENT DOCUMENTS

EP    1791161 A2    5/2007

*Primary Examiner* — Joseph M Pelham

(57) ABSTRACT

An apparatus for treating a disc-shaped article comprises a spin chuck and at least three individually controllable infrared heating elements. The infrared heating elements are mounted in a stationary manner with respect to rotation of said spin chuck. At least the transparent plate positioned between the infrared heating elements and the underside of a wafer is mounted for rotation with the spin chuck. Alternatively, the transparent plate is part of a housing that encloses the infrared heating elements and that rotates with the spin chuck as the heating elements are stationary relative thereto.

20 Claims, 3 Drawing Sheets

(56) References Cited

U.S. PATENT DOCUMENTS

| | | | |
|---|---|---|---|
| 6,198,074 B1 | 3/2001 | Savas | |
| 7,509,035 B2 | 3/2009 | Ranish et al. | |
| 8,294,068 B2* | 10/2012 | Ranish | F27B 17/0025 |
| | | | 118/50.1 |
| 2003/0213436 A1* | 11/2003 | Kwon | C23C 16/34 |
| | | | 118/725 |
| 2006/0086713 A1* | 4/2006 | Hunter | F27B 5/04 |
| | | | 219/411 |
| 2007/0113872 A1 | 5/2007 | Uchida et al. | |
| 2010/0054720 A1* | 3/2010 | Hunter | H01L 21/67248 |
| | | | 392/416 |
| 2010/0055314 A1 | 3/2010 | Kato et al. | |
| 2010/0229797 A1 | 9/2010 | Kato et al. | |
| 2010/0236579 A1 | 9/2010 | Araki et al. | |
| 2013/0042813 A1 | 2/2013 | Kato et al. | |
| 2013/0061805 A1 | 3/2013 | Jin et al. | |
| 2013/0061873 A1 | 3/2013 | Hohenwarter et al. | |
| 2014/0054280 A1 | 2/2014 | Hohenwarter et al. | |
| 2014/0102637 A1 | 4/2014 | Brugger et al. | |
| 2015/0001202 A1* | 1/2015 | Crabb | H01L 21/67115 |
| | | | 219/389 |
| 2016/0068958 A1* | 3/2016 | Kelkar | H01L 21/67115 |
| | | | 118/725 |

* cited by examiner

APPARATUS FOR LIQUID TREATMENT OF WAFER SHAPED ARTICLES AND HEATING SYSTEM FOR USE IN SUCH APPARATUS

CROSS-REFERENCE TO RELATED APPLICATIONS

The present disclosure is a divisional of U.S. patent application Ser. No. 13/894,950 (now U.S. Pat. No. 9,245,777) filed on May 15, 2013. The entire disclosure of the application referenced above is incorporated herein by reference.

BACKGROUND OF THE INVENTION

1. Field of the Invention

The invention relates to an apparatus for liquid treatment of wafer-shaped articles, and to a heating system for use in such an apparatus.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for processing a surface of a disc-shaped article are typically used in the semiconductor industry on silicon wafers, for example of 300 mm or 450 mm diameter. However, such techniques may be applied for other plate-like articles such as compact discs, photo masks, reticles, magnetic discs or flat panel displays. When used in semiconductor industry they may also be applied for glass substrates (e.g. in silicon-on-insulator processes), III-V substrates (e.g. GaAs) or any other substrate or carrier used for producing integrated circuits.

When using heated process liquids, there is a problem in achieving temperature uniformity across the surface of the wafer, and the need to address that problem becomes more acute as wafer diameters increase.

In particular, as the wafer diameter increases, so too will the temperature differential between a liquid at the point where it is applied in a central region of the wafer and the same liquid after it has travelled radially outwardly to the periphery of the wafer. This results in varied etch rates as a function of the distance from the center of the wafer, and hence poor process uniformity.

Conventional approaches to alleviate this problem have included dispensing process liquid from movable arms, so-called "boom swing" dispensers; however, this involves an increase in the cost and complexity of the device as well as its operation. The problem can be addressed to some extent by increasing the flow of process liquid, and/or by dispensing a high temperature liquid such as deionized water on the opposite side of the wafer; however, these techniques result in higher consumption of process liquids.

U.S Patent Application Pub. No. 2013/0061873 describes improved apparatus equipped with an infrared heater for heating a wafer to enhance process uniformity. Although the devices of that patent application represent an improvement over conventional techniques, there remains a need to provide further enhanced process uniformity and equipment that is more robust and easier to maintain.

SUMMARY OF THE INVENTION

Thus, in one aspect, the present invention relates to an apparatus for treating a wafer-shaped article, comprising a spin chuck for holding a wafer-shaped article in a predetermined orientation wherein a lower surface of the wafer-shaped article is spaced a predetermined distance from an upper surface of the spin chuck. At least one infrared heater is mounted above the upper surface of the spin chuck and underlying a wafer-shaped article when mounted on the spin chuck, the at least one infrared heater being stationary in relation to rotation of the spin chuck. A plate that is transparent to infrared radiation emitted by the at least one infrared heater is mounted for rotation with the spin chuck and positioned between the at least one infrared heater and a wafer-shaped article when positioned on the spin chuck.

In preferred embodiments of the apparatus according to the present invention, the plate is part of a housing that surrounds the at least one infrared heater, the housing being mounted for rotation with the spin chuck.

In preferred embodiments of the apparatus according to the present invention, the housing comprises a lower shell surrounding the at least one infrared heater and positioned between the at least one infrared heater and the upper surface of the spin chuck, the lower shell having a reflective interior surface.

In preferred embodiments of the apparatus according to the present invention, the spin chuck comprises a rotatable chuck body surrounding a central stationary post, and the at least one infrared heater is mounted to an upper end of the central stationary post.

In preferred embodiments of the apparatus according to the present invention, the at least one infrared heater is part of a heating assembly comprising at least two, and preferably at least three, independently controllable infrared heating elements.

In preferred embodiments of the apparatus according to the present invention, the housing is centered on an axis of rotation of the spin chuck, and the spin chuck comprises a circular series of pins configured to contact an edge of a wafer-shaped article in a closed position, the pins passing through a corresponding series of openings formed in a periphery of the housing.

In preferred embodiments of the apparatus according to the present invention, each of the independently controllable heating elements comprises at least one curved portion.

In preferred embodiments of the apparatus according to the present invention, a lower shell surrounds the at least one infrared heater and is positioned between the at least one infrared heater and the upper surface of the spin chuck, the lower shell having a reflective interior surface and being stationary in relation to rotation of the spin chuck.

In another aspect, the present invention relates to an infrared heating assembly for use in an apparatus for treating a wafer-shaped article. The infrared heating assembly comprises a housing comprising an upper plate that is transparent to infrared radiation emitted by the infrared heating assembly, and a lower shell having a reflective interior surface. A plurality of infrared heating elements is mounted on a common frame positioned with the housing, the common frame comprising a connector portion projecting downwardly through a central opening in the lower shell. A rotary bearing is positioned outside of the connector portion and inside of the central opening, thereby to permit rotation of the housing relative to the common frame and the plurality of infrared heating elements.

In preferred embodiments of the infrared heating assembly according to the present invention, each of the infrared heating elements is independently controllable and comprises at least one curved portion.

In preferred embodiments of the infrared heating assembly according to the present invention, the curved portions of adjacent infrared heating elements extend along concentric circles.

In preferred embodiments of the infrared heating assembly according to the present invention, the connector portion comprises a plurality of electrical connectors equal in number to the plurality of infrared heating elements, thereby to permit individual connection of each of the plurality of infrared heating elements to a controller for individually energizing each of the plurality of infrared heating elements.

In preferred embodiments of the infrared heating assembly according to the present invention, the housing is rotatable relative to the common frame and the plurality of infrared heating elements about an axis that is perpendicular to the upper plate.

In preferred embodiments of the infrared heating assembly according to the present invention, each of the infrared heating elements comprises at least one curved portion, and the at least one curved portion of each of the infrared heating elements extends along an arc of a circle whose center is offset from the axis.

In preferred embodiments of the infrared heating assembly according to the present invention, the housing comprises a circular series of peripheral openings to permit passage of gripping pins when the infrared heating assembly is mounted to a spin chuck.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
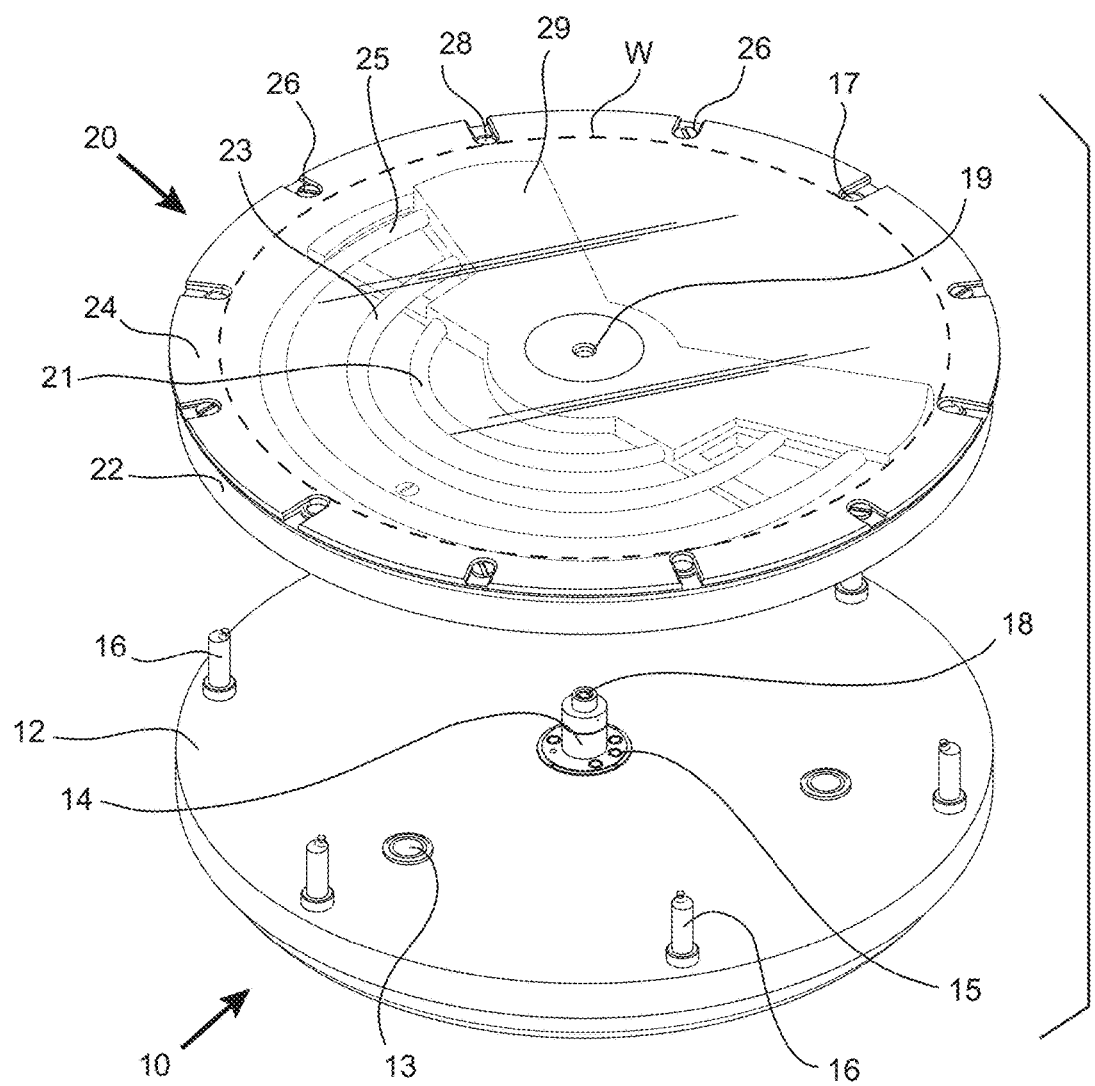
FIG. 1 is an exploded perspective view of an apparatus for treating disc-shaped articles according to an embodiment of the present invention.
Figure 2:
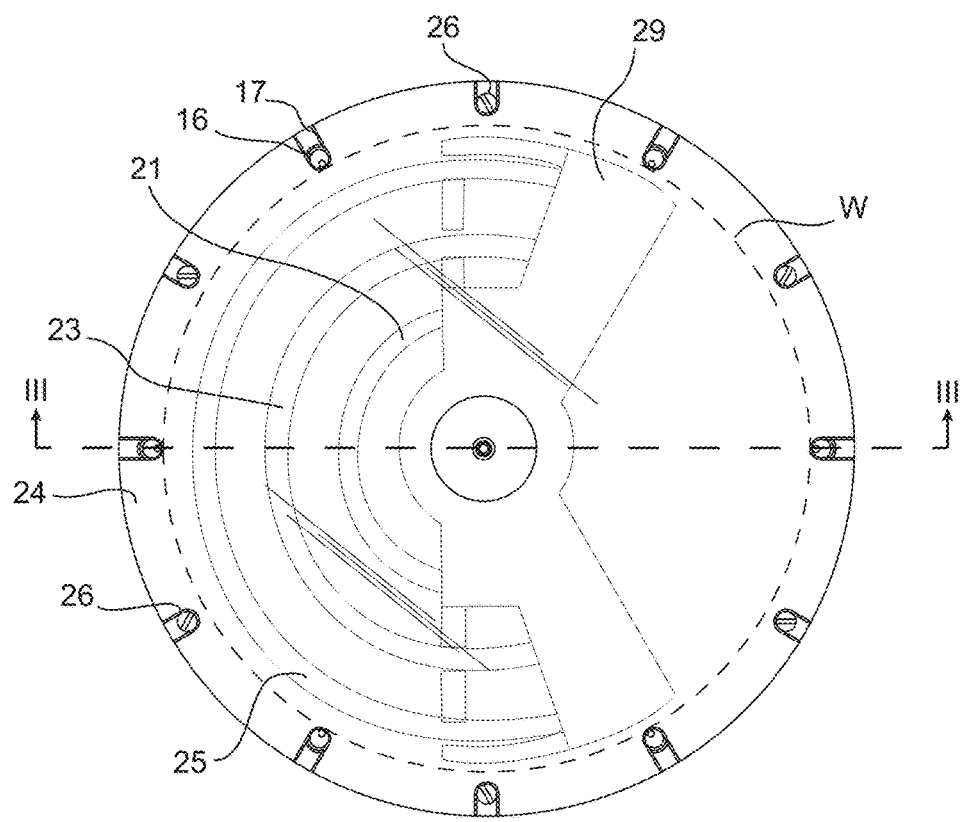
FIG. 2 is top plan view of the embodiment of FIG. 1.

Referring now to the drawings, FIGS. 1 and 2 depict an apparatus made up of two principal subassemblies, namely, a base spin chuck 10 and a modular infrared heating assembly 20. The spin chuck 10 comprises a rotary main body 12 that is mounted for rotation about a stationary central hollow post 14. This post 14 in turn comprises a central nozzle 18 for dispensing process liquid or gas onto the underside of a wafer when mounted on the spin chuck, as well a series of female electrical sockets 15 in a shoulder of the post 14, which sockets receive corresponding male connectors (not shown) that depend downwardly from the heating assembly 20, and which supply driving current to the IR heating lamps inside that assembly 20.

The chuck body 12 has mounted therein a series of gripping pins 16, which operate generally as described in the above-referenced U.S. Pat. No. 4,903,717, in that the pins 16 are driven in unison by a common ring gear between a radially outer open position and a radially inner closed position in which the upper ends of these pins engage the edge of a disc-shaped article to be treated. Chuck body 12 also includes smooth-walled bores 13 that receive corresponding positioning bosses (not shown) that depend downwardly from the heating assembly 20, so as to aid in positioning and supporting the heating assembly 20 in its correct orientation relative to the chuck body 10.

The heating assembly 20 in this embodiment is formed as a modular unit comprising a lower dished housing or shell 22 that contains the IR lamps 21, 23, 25. A cover 24 is screwed onto the lower housing 22 by a series of peripheral screws 26, which are six in number in this embodiment. Screws 26 alternate with six notches or openings 17 that pass entirely through the heating assembly 20 from top to bottom, and which permit passage of the gripping pins 16. The broken line in FIG. 1 designates the position of a wafer W when held by the apparatus, in which position the wafer is supported at its peripheral edge by the distal ends of the gripping pins 16 projecting upwardly through the through bores or notches 17, with the underside of wafer W being spaced by a small defined gap from the cover 24.

The cover 24 in this embodiment is a plate formed from a material that is transparent to the wavelengths of IR radiation emitted by the lamps 21, 23, 25, and this plate 24 may be formed for example of sapphire or quartz glass, as is known to those skilled in this art. The plate 24 has a small central opening 19 formed therein, to permit passage of the upper end of dispensing nozzle 18.

Within the housing of the heating assembly 20, that is, inside the lower housing 22 and beneath the transparent plate 24, there is mounted a set of three infrared heating lamps 21, 23, 25, which are carried by a common frame 29 that also incorporates the associated electrical supply wiring (not shown). The assembly formed by frame 29 and lamps 21, 23, 25 in this embodiment is rigidly mounted to the stationary post 14, whereas the housing formed of lower shell 22 and upper plate 24 is rigidly mounted to the rotary chuck body 12. Therefore, the frame 29 and thus also the lamps 21, 23, 25 that it carries are mounted for rotation relative to the surrounding housing formed of components 22, 24, as will be described in greater detail below.

Referring now to FIG. 2, it can be seen that the wafer W is now supported by the ends of pins 16 projecting through the openings or notches 17 in the heating assembly 20. The wafer W is centered on the heating assembly 20, which in turn is centered on the axis of rotation of the underlying spin chuck. It will be appreciated that the spin chuck 10 is therefore designed to hold a wafer W of a specified diameter. In the embodiments described herein, that diameter is 300 mm, which is a common diameter of silicon wafer at present. However, the apparatus may of course be designed to hold disc-shaped articles of other diameters, such as 200 mm and 450 mm.

In the plan view of FIG. 2 it can be seen that each of the three heating elements 21, 23, 25 in this embodiment is a continuous curved tubular element. Moreover, while these heating elements generally follow a circular arc, and while all three heating elements are preferably substantially concentric, the circles described by those heating elements are not in this embodiment concentric with the center of the heating assembly 20 and hence are not concentric with the axis of rotation of the spin chuck.

Consequently, in this embodiment, both the position and shape of the heating elements 21, 23, 25 is such that, as the wafer W is rotated by the chuck 10 relative to the stationary heating elements 21, 23, 25, each heating element effectively "travels" radially relative to the rotating wafer W, in that each heating elements heats an annular region whose radial extent is significant greater than the cross-sectional diameter of the heating elements.

Figure 3:
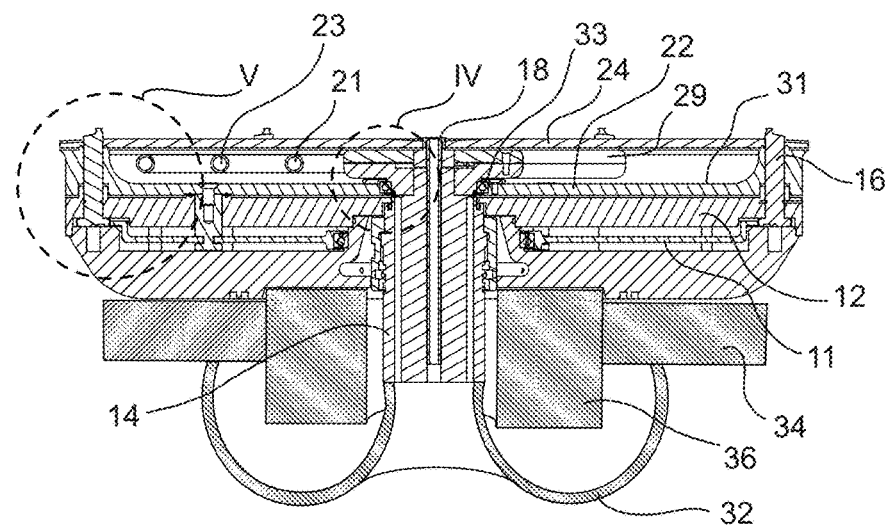
FIG. 3 is an axial section through the chuck depicted in FIGS. 1 and 2, taken along the line III-III of FIG. 2.

In FIG. 3, it can be seen that the frame 29 is supported within the housing 22, 24 by a suitable rotary bearing 33, which permits the housing of the heating assembly 20 to rotate relative to the stationary post 14 with the frame 29 and lamps 21, 23, 25 being mounted in a stationary manner to the post 14. The upwardly-facing surface of the lower housing part or shell 22 is preferably provided with a suitable IR reflective coating 31, to aid in directing the IR radiation emitted by lamps 21, 23, 25, upwardly through the transparent plate 24 and onto the downwardly facing surface of the wafer W.

The stationary post 14 is mounted onto the frame 32 of the apparatus, which in this embodiment also carries a stator 34. Stator 34 in turn drives rotor 36, which is attached to the body 12 of spin chuck 10. Also visible in FIG. 3 is the ring gear 11 mentioned above, which drives the gripping pins 16 in unison.

Figure 4:
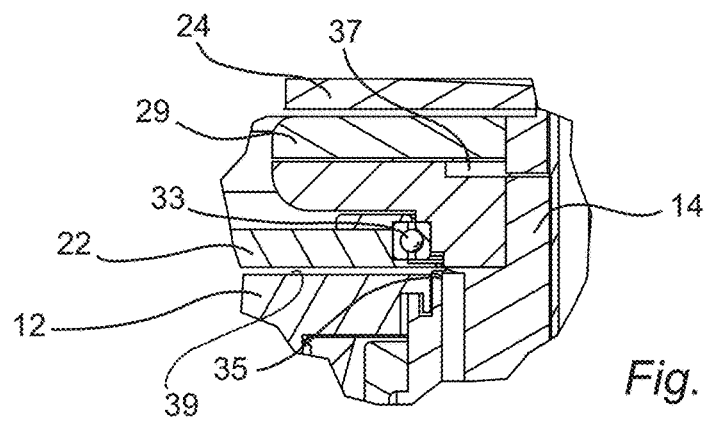
FIG. 4 is an enlarged view of the detail IV designated in FIG. 3.

FIG. 4 shows an inlet 37 into the frame 29 and communicating with an outlet of the post 14, which permits the interior of the heating assembly 20 to be purged for example with nitrogen gas. Also shown in FIG. 4 is a conduit 35 that opens on a shoulder of the post 14, and into the small gap 39 defined between the upper surface of the chuck body 12 and the lower surface of the housing shell 22. Conduit 35 can be advantageously used to supply deionized water to the gap 39, so as to cool the heating assembly 20 upon completion of a heating operation, as well as to regulate the temperature generated by the heating assembly during a heating operation.

Figure 5:
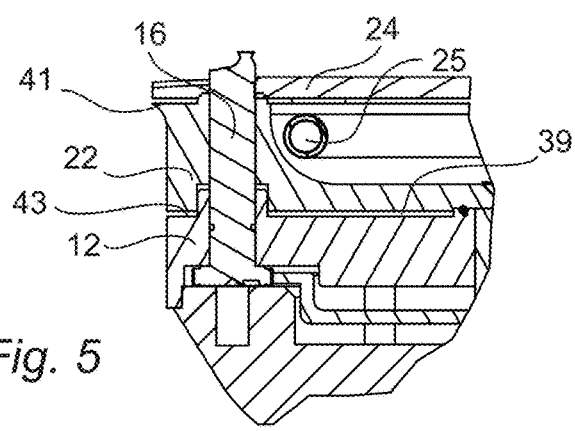
FIG. 5 is an enlarged view of the detail V designated in FIG. 3.

Visible in FIG. 5 is a gap 41 provided between the transparent cover 24 and the lower shell housing 22, which permits nitrogen purge gas introduced into the housing to be exhausted outwardly therefrom. Similarly, gap 43 shown in FIG. 5 permits the escape of the deionized water (or, if desired, nitrogen gas) that had been introduced into the gap 39 between the bottom of shell 22 and the upper surface of chuck body 12.

Figure 6:
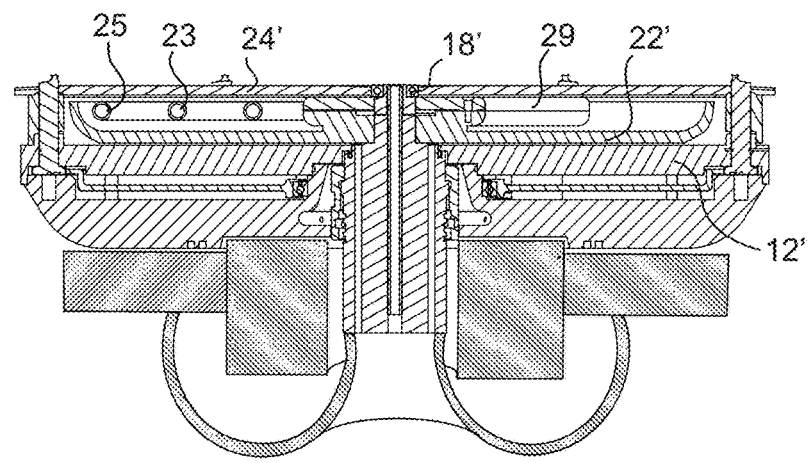
FIG. 6 is an axial sectional view similar to that of FIG. 3, of another embodiment of an apparatus for treating disc-shaped articles according to the present invention.

In the alternative embodiment of FIG. 6, the transparent plate 24' still rotates with the spin chuck 10, and pins 16' still pass upwardly through openings formed in the transparent plate 24'. However, the lower shell 22' of this embodiment is now rigidly secured to the post 14 in a cantilever manner, along with the frame 29 and lamps 21, 23, 25. This embodiment is otherwise as described above in connection with the preceding embodiment.

It is advantageous for the transparent plate 24, 24' to rotate with the spin chuck 10 as in these embodiments, because any droplets of process liquid adhering to the transparent plate 24, 24' will thereby be spun off. However, in a still further embodiment, the entire heating assembly may be mounted in a stationary manner on the post 14, as is described for example in connection with the heating assembly disclosed in commonly-owned co-pending application U.S Patent Application Pub. No. 2013/0061873.

It is to be noted that the heating lamps in each of the preceding embodiments are preferably individually controllable. It is particularly preferred that each lamp can be not only switched on and off independently of the others, but also that the wattage to each lamp can be independently varied. This permits a variety of advantageous process control.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a wafer-shaped article, comprising:
   a spin chuck for holding a wafer-shaped article in a predetermined orientation wherein a lower surface of the wafer-shaped article is spaced a predetermined distance from an upper surface of the spin chuck;
   at least one heater mounted above said upper surface of said spin chuck and underlying a wafer-shaped article when mounted on the spin chuck, said at least one heater being stationary in relation to rotation of said spin chuck; and
   a plate that is transparent to radiation emitted by said at least one heater, said plate being mounted for rotation with said spin chuck and being positioned between said at least one heater and a wafer-shaped article when positioned on said spin chuck.

2. The apparatus according to claim 1, wherein said plate is part of a housing that surrounds said at least one heater, said housing being mounted for rotation with said spin chuck.

3. The apparatus according to claim 2, wherein said housing comprises a lower shell surrounding said at least one heater and positioned between said at least one heater and said upper surface of said spin chuck, said lower shell having a reflective interior surface.

4. The apparatus according to claim 1, wherein said spin chuck comprises a rotatable chuck body surrounding a central stationary post, and wherein said at least one heater is mounted to an upper end of said central stationary post.

5. The apparatus according to claim 1, wherein said at least one heater is part of a heating assembly comprising at least two independently controllable heating elements.

6. The apparatus according to claim 2, wherein said housing is centered on an axis of rotation of said spin chuck, and wherein said spin chuck comprises a circular series of pins configured to contact an edge of a wafer-shaped article in a closed position, said pins passing through a corresponding series of openings formed in a periphery of said housing.

7. The apparatus according to claim 5, wherein each of said independently controllable heating elements comprises at least one curved portion.

8. The apparatus according to claim 1, further comprising a lower shell surrounding said at least one heater and positioned between said at least one heater and said upper surface of said spin chuck, said lower shell having a reflective interior surface and being stationary in relation to rotation of said spin chuck.

9. The apparatus according to claim 1, wherein said at least one heater is part of a heating assembly comprising at least three independently controllable heating elements.

10. A heating assembly for use in an apparatus for treating a wafer-shaped article, said heating assembly comprising:
    a housing comprising an upper plate that is transparent to radiation emitted by said heating assembly, and a lower shell having a reflective interior surface;
    a plurality of heating elements mounted on a common frame positioned within said housing, said common frame comprising a connector portion projecting downwardly through a central opening in said lower shell; and a rotary bearing positioned outside of said connector portion and inside of said central opening, thereby to permit rotation of said housing relative to said common frame and said plurality of heating elements;

wherein said housing is rotatable relative to said common frame and said plurality of heating elements about an axis that is perpendicular to said upper plate.

11. The heating assembly according to claim 10, wherein each of said heating elements is independently controllable and comprises at least one curved portion.

12. The heating assembly according to claim 11, wherein the curved portions of adjacent heating elements extend along concentric circles.

13. The heating assembly according to claim 10, wherein said connector portion comprises a plurality of electrical connectors equal in number to said plurality of heating elements, thereby to permit individual connection of each of said plurality of heating elements to a controller for individually energizing each of said plurality of heating elements.

14. The heating assembly according to claim 10, wherein each of said heating elements comprises at least one curved portion, and wherein said at least one curved portion of each of said heating elements extends along an arc of a circle whose center is offset from said axis.

15. The heating assembly according to claim 10, wherein said housing comprises a circular series of peripheral openings to permit passage of gripping pins when said heating assembly is mounted to a spin chuck.

16. A heating assembly for use in an apparatus for treating a wafer-shaped article, said heating assembly comprising:

a housing comprising an upper plate that is transparent to radiation emitted by said heating assembly, and a lower shell having a reflective interior surface, said housing comprising a circular series of peripheral openings to permit passage of gripping pins when said heating assembly is mounted to a spin chuck;

a plurality of heating elements mounted on a common frame positioned within said housing, said common frame comprising a connector portion projecting downwardly through a central opening in said lower shell; and a rotary bearing positioned outside of said connector portion and inside of said central opening, thereby to permit rotation of said housing relative to said common frame and said plurality of heating elements.

17. The heating assembly according to claim 16, wherein each of said heating elements is independently controllable and comprises at least one curved portion.

18. The heating assembly according to claim 16, wherein said connector portion comprises a plurality of electrical connectors equal in number to said plurality of heating elements, thereby to permit individual connection of each of said plurality of heating elements to a controller for individually energizing each of said plurality of heating elements.

19. The heating assembly according to claim 16, wherein said housing is rotatable relative to said common frame and said plurality of heating elements about an axis that is perpendicular to said upper plate.

20. The heating assembly according to claim 18, wherein each of said heating elements comprises at least one curved portion, and wherein said at least one curved portion of each of said heating elements extends along an arc of a circle whose center is offset from said axis.

* * * * *